United States Patent
Ye et al.

(10) Patent No.: US 8,722,456 B2
(45) Date of Patent: May 13, 2014

(54) METHOD FOR PREPARING P-TYPE ZNO-BASED MATERIAL

(75) Inventors: Zhizhen Ye, Hangzhou (CN); Yangfan Lu, Hangzhou (CN); Kewei Wu, Hangzhou (CN); Jingyun Huang, Hangzhou (CN); Qikuo Ye, Hangzhou (CN)

(73) Assignee: Hangzhou Bluelight Opto-Electronic Material Co., Ltd. (CN)

( * ) Notice: Subject to any disclaimer, the term of this patent is extended or adjusted under 35 U.S.C. 154(b) by 0 days.

(21) Appl. No.: 13/825,197

(22) PCT Filed: Sep. 25, 2010

(86) PCT No.: PCT/CN2010/077253
§ 371 (c)(1),
(2), (4) Date: Mar. 20, 2013

(87) PCT Pub. No.: WO2012/037729
PCT Pub. Date: Mar. 29, 2012

(65) Prior Publication Data
US 2013/0183797 A1    Jul. 18, 2013

(51) Int. Cl.
*H01L 21/00* (2006.01)
*H01L 21/16* (2006.01)

(52) U.S. Cl.
USPC .............. 438/104; 438/478; 438/510; 117/84

(58) Field of Classification Search
None
See application file for complete search history.

(56) References Cited

U.S. PATENT DOCUMENTS 6,475,825 B2 * 11/2002 White et al. .................. 438/104
6,896,731 B1 * 5/2005 Yamamoto et al. ........... 117/108

OTHER PUBLICATIONS

Li et al, Chemical vapor deposition-formed p-type ZnO thin films, J. Vac. Sci. Technol. A 21, 1342 (2003).*
Lu et al, Local p-type conduction of Na-doped ZnO thin films grown by MOCVD, Chemical Physics Letters, vol. 582, Sep. 4, 2013, pp. 82-85.*
Li X, P-Type ZnO Thin Films Grown by MOCVD, prepared for 31st IEEE Photovoltaics Specialists Conference, Lake Buena Vista, FL, Feb. 2005, pp. 1-3.
Yang L.L., Fabrication of P-Type Zno Thin Films via DC Reactive Magnetron Sputtering by Using Na as the Dopan Source, Electronic Materials, Feb. 6, 2007, Vo. 36, No. 4, pp. 498-500.
CN101183595A (Univ. Zhejiang) May 21, 2008 (p. 2 paragraph 4 to p. 5 paragraph 3 in description).
CN 101235536A (Univ. Zhejiang) Aug. 6, 2008 (the whole document).
CN1696356A (ChangChun Inst. Optics & Fine Mechnaics C.) Nov. 15, 2005 (the whole document).

* cited by examiner

*Primary Examiner* — Andres Munoz

(57) ABSTRACT

The embodiments disclosed a method for preparing a p-type ZnO-based material, the method conducted in a metal organic chemical vapor deposition (MOCVD) system, including cleaning a surface of a substrate and placing the substrate in a growth chamber of the metal organic chemical vapor deposition system, vacuumizing the growth chamber to $10^{-3}$-$10^{-4}$ Pa, heating the substrate to 200-700° C., introducing an organic Zn source, an organic Na source and oxygen, and depositing the p-type ZnO-based material on the substrate. Na-doping is capable of greatly improving hole concentration and p-type stability in the ZnO-based material, and use of Na-doping technology in combination with MOCVD equipment provides a p-type ZnO-based material having excellent crystal quality and electrical and optical qualities.

5 Claims, No Drawings

METHOD FOR PREPARING P-TYPE ZNO-BASED MATERIAL

FIELD OF THE INVENTION

The present invention belongs to the technical field of semiconductor materials, which relates to a method for preparing a p-type ZnO-based material, particularly to a method for p-type doping using organic sodium source in a metal organic chemical vapor deposition (MOCVD) equipment.

BACKGROUND OF THE INVENTION

Wide band gap compound semiconductor ZnO and ZnO-based alloy materials are considered as ideal materials for short-wavelength optoelectronic device due to having a series of excellent characteristics. Natural ZnO behaves as n-type, and it would produce a high self-compensation effect because of a lot of intrinsic donor deficiencies existing in ZnO; moreover, a plurality of acceptor elements in ZnO have low solid solubility and deep energy level, thus p-type doping of ZnO has once become a great international scientific problem. Recently, under the efforts made by the scientists around the world, the research on p-type doping of ZnO has made a series of important progresses, it is no longer a problem to achieve p-type doping of ZnO. However, it is not easy to prepare high quality p-type ZnO-based materials having practical application values, and it is still difficult to prepare p-type ZnO-based materials with relatively high hole concentration, high mobility, low resistance, as well as stable electrical and optical performances, which, however, are the important basis for wide application of ZnO-based light-emitting devices. Currently, the acceptor doping elements in ZnO which researched and reported frequently mainly comprise group V elements N, P, As, Sb and group I element Li, however, there is no common understanding on which kind of element is most suitable for p-type doping of ZnO, each doping element has its own advantages and disadvantages, the researchers have not found a universal p-type doping process yet. Seen from the results upon theoretical calculation, Na element is an excellent acceptor element, but it is usually difficult to be introduced into ZnO due to its very active properties, thus few people have done researches on said element, so do the related research reports. Our experimental results show that Na indeed can well play the role of an acceptor in ZnO, and ZnO with Na-doping has good p-type exhibition. It is required to employ a MOCVD equipment universally used in the current semiconductor industrial production in order to popularize such doping technology, in particular the application thereof in industrial production. However, it is required to use a Na-containing organic source as precursor if said device is used for Na-doping, but relevant organic sources cannot be found in the current market. The present invention exactly aims at solving said problem.

SUMMARY OF THE INVENTION

The present invention aims at overcoming the problem existing in doping with other acceptor elements, and providing a method for preparing a p-type ZnO-based material.

The embodiments disclose a method for preparing a p-type ZnO-based material, the method conducted in a metal organic chemical vapor deposition equipment system, including cleaning a surface of a substrate and placing the substrate in a growth chamber of the metal organic chemical vapor deposition system, vacuumizing the growth chamber to $10^{-3}$–$10^{-4}$ Pa, heating the substrate to 200–700° C., introducing an organic Zn source, an organic Na source and oxygen, and depositing the p-type ZnO-based material on the substrate, wherein the organic Na source is one of cyclopentadienyl sodium, methylcyclopentadienyl sodium and pentamethylcyclopentadienyl sodium.

Further, a further organic source is introduced simultaneously with introducing the organic Zn source, organic Na source and oxygen.

Further, said further organic source is Mg source, Cd source or Be source.

Further, the substrate is zinc oxide single crystal, silicon carbide, sapphire, quartz, silicon or glass.

Further, the organic Zn source is diethyl zinc or dimethyl zinc; the organic Mg source is magnesocene or methyl magnesocene; the organic Cd source is dimethyl cadmium or diethyl cadmium; the organic Be source is dimethyl beryllium or diethyl beryllium.

The present invention has the following beneficial effects:

1. Na-doping is capable of greatly improving hole concentration and p-type stability in the ZnO-based material, and use of Na-doping technology in combination with an MOCVD equipment can prepare a p-type ZnO-based material having excellent crystal quality and electrical and optical performances.

2. Adopting an organic substance such as cyclopentadienyl sodium as a metal organic source for Na-doping can realize industrial production of the Na-doped p-type ZnO-based material.

SPECIFIC EMBODIMENTS

The method of the present invention for preparing a p-type ZnO-based material employs a metal organic chemical vapor deposition (MOCVD) system, including the following steps: cleaning the surface of a substrate and placing the substrate in a growth chamber of the metal organic chemical vapor deposition system, vacuumizing the growth chamber to $10^{-3}$–$10^{-4}$ Pa, heating the substrate to 200–700° C., introducing an organic Zn source, an organic Na source and oxygen, optionally a further organic source (such as Mg source, Cd source or Be source) can be introduced simultaneously, and depositing the p-type ZnO-based material on the substrate.

Wherein, the substrate may employ zinc oxide single crystal, silicon carbide, sapphire, quartz, silicon, glass, and the like.

The organic Na source employs cyclopentadienyl sodium, methyl cyclopentadienyl sodium or pentamethyl cyclopentadienyl sodium, or other organic sodium salts having similar physicochemical properties, this type of organic sodium salts can be stably present in vacuum or inert atmosphere at room temperature, can be brought by nitrogen or hydrogen gas into the growth chamber of the MOCVD system by means of bubbling or blowing, and can be reacted violently with oxygen to generate Na-containing oxides and other gaseous substances.

The organic Zn source may employ diethyl zinc or dimethyl zinc; the organic Mg source may employ magnesocene or methyl magnesocene; the organic Cd source may employ dimethyl cadmium or diethyl cadmium; the organic Be source may employ dimethyl beryllium or diethyl beryllium.

The p-type ZnO-based material prepared by the method of the present invention comprises thin-film or nanomaterials such as ZnO, ZnMgO, ZnCdO, and ZnBeO.

The present invention will be further explained in combination with examples.

EXAMPLE 1

The p-type ZnO material in this example is prepared on a sapphire substrate by using a MOCVD system. Firstly, the sapphire substrate is ultrasonically cleaned with acetone or anhydrous ethanol for 10~30 minutes, rinsed with deionized water, and blow-dried with nitrogen gas. Then, the cleaned sapphire substrate is placed in a growth chamber of the metal organic chemical vapor deposition system, the growth chamber is vacuumized to $10^{-3}$ Pa, the substrate is heated to 400° C., an organic Zn source of diethyl zinc, an organic Na source of cyclopentadienyl sodium, and oxygen are introduced, wherein the organic Zn source, the organic Na source and the oxygen have a flow ratio of 2:1:1, and one layer of p-ZnO thin-film with a thickness of 300 nm is deposited on the substrate. The p-type ZnO thin film prepared in this example has a hole concentration of $10^{17}$ cm$^{-3}$.

EXAMPLE 2

The p-type ZnMgO material in this example is prepared on a glass substrate by using a MOCVD system. Firstly, the glass substrate is ultrasonically cleaned with acetone or anhydrous ethanol for 10~30 minutes, rinsed with deionized water, and blow-dried with nitrogen gas. Then, the cleaned glass substrate is placed in a growth chamber of the metal organic chemical vapor deposition system, the growth chamber is vacuumized to $10^{-4}$ Pa, the substrate is heated to 650° C., an organic Zn source of diethyl zinc, an organic Mg source of methyl magnesocene, an organic Na source of cyclopentadienyl sodium, and oxygen are introduced, wherein the organic Zn source, the organic Mg source, the organic Na source and the oxygen have a flow ratio of 2: 5:1:1, and one layer of p-ZnMgO thin-film with a thickness of 300 nm is deposited on the substrate. The p-type ZnMgO thin film prepared in this example has a hole concentration of $10^{16}$ cm$^{-3}$.

EXAMPLE 3

The p-type ZnO material in this example is prepared on a zinc oxide single crystal substrate by using a MOCVD system. Firstly, the zinc oxide single crystal substrate with a cleaned surface is placed in a growth chamber of the metal organic chemical vapor deposition system, the growth chamber is vacuumized to $10^{-3}$ Pa, the substrate is heated to 400° C., an organic Zn source of diethyl zinc, an organic Na source of cyclopentadienyl sodium, and oxygen are introduced, wherein the organic Zn source, the organic Na source and the oxygen have a flow ratio of 2:1:1, and one layer of p-ZnO thin-film with a thickness of 300 nm is deposited on the substrate. The p-type ZnO thin film prepared in this example can form a homogeneous p-n junction having excellent qualities with the n-type ZnO single crystal substrate, exhibit rectification characteristics and achieve electroluminescence at room temperature.

EXAMPLE 4

The p-type ZnCdO material in this example is prepared on a quartz substrate by using a MOCVD system. First, the quartz substrate is ultrasonically cleaned with acetone or anhydrous ethanol for 10~30 minutes, rinsed with deionized water, and blow-dried with nitrogen gas. Then, the cleaned quartz substrate is placed in a growth chamber of the metal organic chemical vapor deposition system, the growth chamber is vacuumized to $10^{-4}$ Pa, the substrate is heated to 200° C., an organic Zn source of diethyl zinc, an organic Cd source of dimethyl cadmium, an organic Na source of cyclopentadienyl sodium, and oxygen are introduced, wherein the organic Zn source, the organic Cd source, the organic Na source and the oxygen have a flow ratio of 2:1:1:1, and one layer of p-ZnCdO thin-film with a thickness of 300 nm is deposited on the substrate. The p-type ZnCdO thin film prepared in this example has a hole concentration of $10^{16}$ cm$^{-3}$.

The above examples are used to set forth the present invention, instead of limiting the present invention. Any amendments and modifications made to the present invention within the spirit of the present invention and the protection scopes of the claims fall into the protection scope of the present invention.

The invention claimed is:

1. A method for preparing a p-type ZnO-based material, the method conducted in a metal organic chemical vapor deposition system, the method comprising:
    cleaning a surface of a substrate and placing the substrate in a growth chamber of the metal organic chemical vapor deposition system;
    vacuumizing the growth chamber to $10^{-3}$-$10^{-4}$ Pa;
    heating the substrate to 200-700° C.;
    introducing an organic Zn source, an organic Na source and oxygen; and
    depositing the p-type ZnO-based material on the substrate, wherein the organic Na source is one of cyclopentadienyl sodium, methylcyclopentadienyl sodium and petamethylcyclopentadienyl sodium.

2. The method of claim 1, further comprising introducing a further organic source simultaneously with the organic Zn source, the organic Na source and the oxygen.

3. The method of claim 2, wherein the further organic source is one of a Mg source, a Cd source and a Be source.

4. The method of claim 3, wherein the organic Zn source is one of diethyl zinc and dimethyl zinc, the organic Mg source is one of magnesocene and methyl magnesocene, the organic Cd source is one of dimethyl cadmium and diethyl cadmium, and the organic Be source is dimethyl beryllium and diethyl beryllium.

5. The method of claim 1, wherein the substrate is one of zinc oxide single crystal, silicon carbide, sapphire, quartz, silicon and glass.

* * * * *